United States Patent [19]
Van Dijck

[11] Patent Number: 5,134,288
[45] Date of Patent: Jul. 28, 1992

[54] METHOD OF DIRECTLY DERIVING AMPLITUDE AND PHASE INFORMATION OF AN OBJECT FROM IMAGES PRODUCED BY A HIGH-RESOLUTION ELECTRON MICROSCOPE

[75] Inventor: Dirk E. M. Van Dijck, Aartselaar, Belgium

[73] Assignee: U.S. Philips Corp., New York, N.Y.

[21] Appl. No.: 731,676

[22] Filed: Jul. 17, 1991

[30] Foreign Application Priority Data

Aug. 10, 1990 [NL] Netherlands ............... 9001800

[51] Int. Cl.$^5$ .................................... H01J 37/26
[52] U.S. Cl. .................................... 250/307; 250/311
[58] Field of Search ............... 250/307, 311, 397, 306

[56] References Cited

U.S. PATENT DOCUMENTS 4,553,030 11/1985 Tokiwai et al. ............... 250/307

FOREIGN PATENT DOCUMENTS 57-69654 4/1982 Japan ............... 250/311

Primary Examiner—Jack I. Berman
Attorney, Agent, or Firm—William L. Botjer

[57] ABSTRACT

A high-resolution electron microscope (1) comprising a detection system (11), an image processing system (13) and an effective electron source (3) ensuring a comparatively small thermal energy spread of the electrons to be emitted is suitable for executing a method for directly deriving amplitude and phase information of an object (17) in the form of an electron wave function $\phi$. To this end, a number of images of an object (17) are recorded by means of a high-resolution electron microscope (1) in image planes (19) with defocus values which differ only slightly. Thus, a substantially continuous series of images is formed as a function of the defocus value, resulting in a substantially three-dimensional image area. A quasi-three-dimensional Fourier transformation is performed thereon in order to separate linear and non-linear image information for the reconstruction of the electron wave function. In practice a two-dimensional Fourier transformation is applied to the recorded images which are subsequently multiplied by a complex weighting factor, followed by summing. As a result, the linear information is concentrated on two spheres in the Fourier space, the non-linear information being uniformly distributed across the Fourier space.

14 Claims, 1 Drawing Sheet

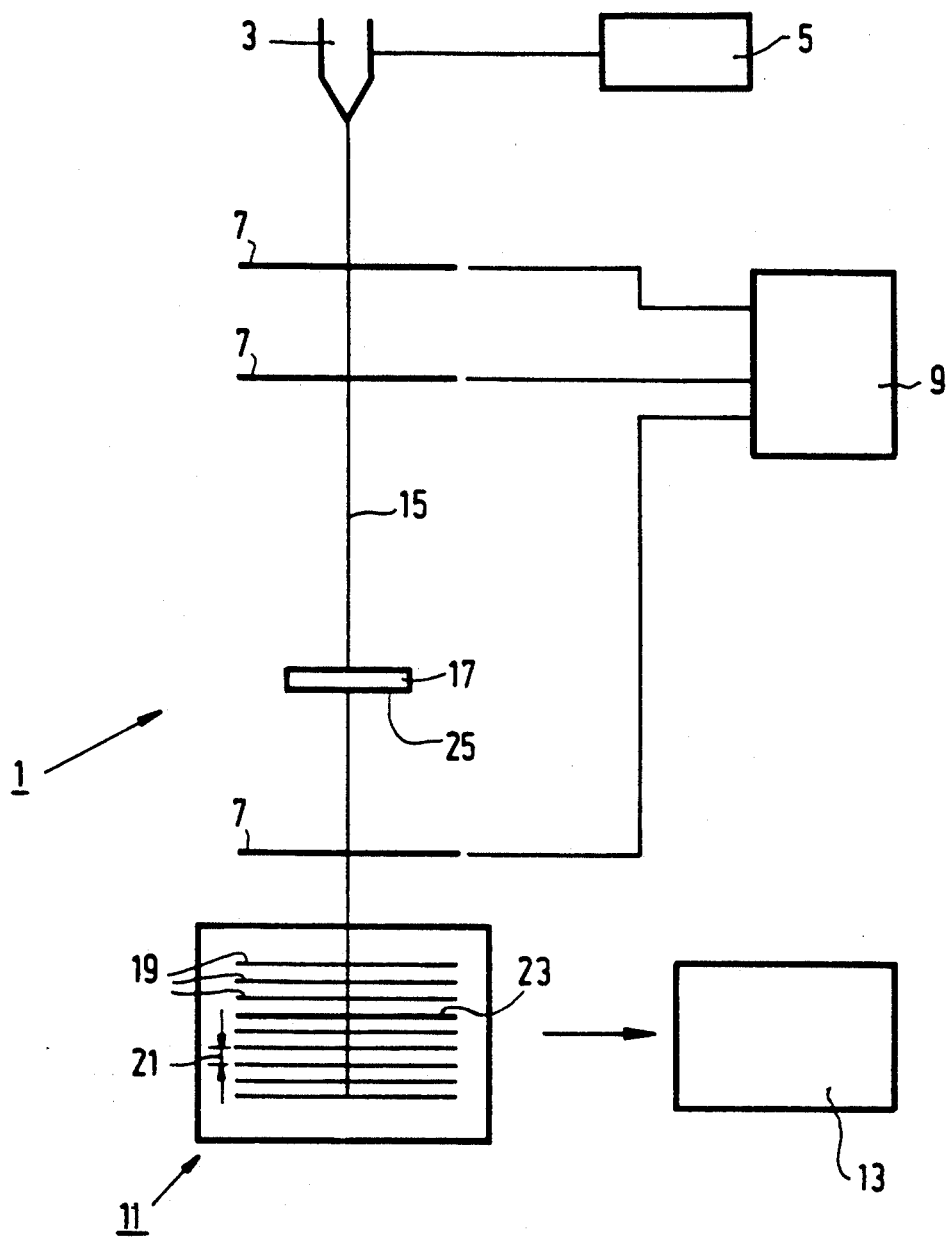

METHOD OF DIRECTLY DERIVING AMPLITUDE AND PHASE INFORMATION OF AN OBJECT FROM IMAGES PRODUCED BY A HIGH-RESOLUTION ELECTRON MICROSCOPE

BACKGROUND OF THE INVENTION

The invention relates to a method for directly deriving amplitude and phase information of an object as an electron wave function formed by means of a number of object images recorded with a high-resolution electron microscope, said images being recorded in image planes with slightly different defocus values.

The invention also relates to a high-resolution electron microscope suitable for performing a method in accordance with the invention.

A method of the kind set forth is known from the publication "A new procedure for wave function restoration in high-resolution electron microscopy" by D. Van Dyck and W. Coene in Optik 77, No. 3 (1987), pp. 125–128. The method described therein is based on the intensity of an image and the derivative thereof for a selected defocus value. In practice a number of images are preferably recorded in a limited number of image planes with defocus values in the range of the selected defocus value which deviate only little from one another. Such a gradient method is rather cumbersome and utilizes exclusively information from microscope images around the selected defocus value. Moreover, the defocus step required between two images to be recorded in order to ensure suitable execution of the method is too small to be feasible in contemporary high-resolution electron microscopes. Moreover, this method is too susceptible to the presence of noise in the experimental images.

SUMMARY OF THE INVENTION

It is an object of the invention to provide a method of the kind set forth in which said drawbacks are mitigated. To achieve this, a method in accordance with the invention is characterized in that the spacing of the image planes is chosen to be so small that, through a substantially continuous series of images as a function of the defocus value, a substantially three-dimensional image area is recorded, on which a quasi-three-dimensional Fourier transformation is performed so as to separate linear and non-linear image information in order to restore the electron wave function.

Due to the information recording method used, actually information concerning a three-dimensional image space is recorded. As a result, the maximum permissible defocus step is less critical and readily achievable in existing electron microscopes. For the restoration of the electron wave function it is necessary to separate linear and non-linear image information. A quasi-three-dimensional Fourier transformation is a suitable approach in this respect.

A preferred version of the method in accordance with the invention is characterized in that a quasi-three-dimensional Fourier transformation is achieved by two-dimensional Fourier transformation of the recorded images, followed by multiplication by a complex weighting factor describing backpropagation of an image to a selected reference image plane and compensating for chromatic aberration. Because only a two-dimensional Fourier transformation is executed actually instead of a three-dimensional Fourier transformation, the procedure is substantially simplified and less time-consuming. Because each recorded image is backpropagated to one and the same reference image plane for summing at a later stage, the image part containing the linear image information is in principle identical at that area, leading to superposition during summing. Non-linear image information, however, differs for all images and upon summing it is reduced through averaging with respect to the linear part.

A preferred version of the method in accordance with the invention is characterized in that the linear image information is concentrated on spheres in a Fourier space, the non-linear image information being uniformly distributed across the Fourier space. Because the linear image information is concentrated in a defined locus in the Fourier space, that is to say on two spheres, which are in the approximation of this method two paraboloids, the linear image information is separated from the nonlinear image information by selecting the information on the paraboloids. A further advantage in this respect consists in that the signal-to-noise ratio is enhanced.

A further preferred version of the method in accordance with the invention is characterized in that the chromatic aberration of the high-resolution electron microscope is corrected by dividing, in each point of the spheres, the value in that point by a attenuation factor for chromatic aberration in the relevant point. Because only the information on the paraboloid contributes to the electron wave function, it suffices to compensate for chromatic aberration exclusively in those points of the Fourier space and deconvolution of the entire space is not necessary. As a result, fewer problems are experienced from the noise present.

Another preferred version of the method in accordance with the invention is characterized in that the method utilizes an iterative repetition to intensify the linear part with respect to the non-linear part. Iterative repetition means that the non-linear contribution on the sphere, or paraboloid, from the last cycle is substracted in the next cycle of iteration. Consequently, iterative repetition of the procedure maximizes the ratio of the linear part to the non-linear part of the image information. The electron wave function of the object is thus optimized.

A further preferred version of the method in accordance with the invention is characterized in that the electron wave function at the exit plane of the object is calculated from the electron wave function in the reference image plane by multiplying the two-dimensional Fourier transformation of the electron wave function at the reference image plane by a phase factor for correction of spherical aberration and defocus, astigmatism and beam tilt and by subsequently performing an inverse two-dimensional Fourier transformation. The method thus utilizes the known transfer function theory. Upon backpropagation of the electron wave function in a reference image plane to the exit plane of the object, before extension of an inverse two-dimensional Fourier transformation there is performed a multiplication by a phase factor which compensates for microscope faults such as spherical aberration and defocus, astigmatism and beam tilt.

A further preferred version of the method in accordance with the invention is characterized in that after backpropagation of the electron wave function from the image plane to the exit plane of the object, a channelling operation is performed to determine a projected atomic structure of the object. It is to be noted that methods for backpropagating information from an image plane to an object plane are known per se. Using such a method, the phase shift caused by spherical aberration and defocus, astigmatism and defocus can be eliminated. For the determination of the structure of the object, being the ultimate goal of the procedure, use can be made of algorithms based on channelling theory.

A preferred version of the method in accordance with the invention is characterized in that it is used for resolution enhancement of images recorded in a high-resolution electron microscope. It is known per se that the potential distribution at the exit plane of an object and hence the wave function, intrinsically contains information with a resolution which is higher than can be reproduced, after imaging, by a high-resolution electron microscopes due to the limitations existing as regards point resolution of the electron microscopes. Using the described method, the maximum point resolution that can be achieved in contemporary high-resolution electron microscope can be improved by a factor 2 and a point resolution equal to the intrinsically present image information resolution can be achieved.

A further preferred version of the method in accordance with the invention is characterized in that for the determination of focus drift occurring during recording of a series of images, a number of images having different defocus values are recorded in an opposite direction, the focus drift being determined by comparison of two extreme images. Because the recording of a large number of images (for example, 50 images) is desirable for suitable analysis, focus drift can occur despite the comparatively short period of time required for recording, so that after determination of the degree of focus drift correction can take place via the transfer function.

Another preferred version of the method in accordance with the invention is characterized in that for the determination of object drift occurring during the recording of a series of images, a cross correlation of images with for neighbouring defocus values is made, the drift of the object being determined from a mutual lateral shift. Considering again the duration of recording, object drift can occur for which correction can take place if the extent of drift is known.

A further preferred version of the method in accordance with the invention is characterized in that a measure of beam tilting is derived from a shift of a sphere, representing linear image information, in a Fourier space. Contrary to focus drift and object drift, occurring during recording, beam tilting is dependent on the alignment of the microscope at the start of recording. After determination of beam tilting, correction can again take place via the transfer function.

The method in accordance with the invention can be successfully used in a high-resolution electron microscope. To this end, such a high-resolution electron microscope is characterized in that it comprises a detection system, an image processing system, and an effective electron source which ensures a comparatively small thermal energy spread of electrons to be emitted. Thermal energy spread in the electron beam leads to disturbing artefacts in images to be recorded since the energy spread causes focus fluctuation. Subject to the condition that fluctuations are due to instabilities in the acceleration potential and that lens currents are already minimum, the resolution can be optimized by taking the above step.

A preferred embodiment of the electron microscope in accordance with the invention is characterized in that the detection system comprises a detection medium which can be read on-line and which has a sensitivity and resolution comparable to the sensitivity and resolution of, for example a photographic plate. Because of the large number of images to be recorded per measurement, it is substantially impractical to use photographic plates. The mechanical transport thereof between two exposures is rather time-consuming and the capacity of a batch of plates is not enough for the number of images required. Therefore, the detection medium should be faster, have a high storage capacity and have at least the same sensitivity for the desired resolution.

The invention will be described in detail hereinafter with reference to the drawing.

BRIEF DESCRIPTION OF THE DRAWINGS

The sole FIGURE of the drawing diagrammatically shows a high-resolution electron microscope suitable for carrying out a method in accordance with the invention.

DETAILED DESCRIPTION OF THE PREFERRED EMBODIMENT

The high-resolution electron microscope 1 which is diagrammatically shown in the Figure comprises an electron source 3 which is fed by a high-voltage generator 5, and also comprises a number of lenses which are fed by a lens power supply source 9. The electron microscope 1 also comprises a detection system 11, the detected information being applied to an image processing system 13. The electron beam 15 is incident on an object 17. Using a method in accordance with the invention, amplitude and phase information of the object 17 can be derived in the form of an electron wave function $\phi$. The projection of the atomic structure of the object 17 can be derived from this wave function $\phi$.

To this end, a number of high-resolution images of the object 17 are recorded in image planes 19 with slightly different defocus values. The focus interval 21 between the various image planes 19 in which measurement takes place is in the order of magnitude of the minimum defocus step of the electron microscope 1. In contemporary electron microscopes, said step amounts to from 2 to 3 nm. By scanning the defocus axis in such small steps, a substantially continuous series of images is formed as a function of the defocus value, so that the information thus obtained may be considered to form a three-dimensional image area. Each image contains linear and non-linear information. Linear information is to be understood to mean the part of the image contrast which is proportional to the wave function $\phi$. A method aiming to restore the wave function $\phi$ should separate the linear and the non-linear part. This separation is realised according to the described method by performing a quasi-three-dimensional Fourier transformation on said three-dimensional image space.

In practice the procedure is substantially simplified and accelerated by two-dimensional Fourier transformation of the images, followed by multiplication by a complex weighting factor; this offers the same result as a three-dimensional Fourier transformation. These complex weighting factors comprise an amplitude part and a phase part. The phase part ensures that each image is backpropagated to a selected reference image plane 23. The amplitude part corrects for attenuation due to chromatic aberration. Chromatic aberration is caused by time-dependent and time-independent deviations of the energy of the emitted electrons and of instabilities of the lens currents. As a result, different electrons can experience a different focus. The spread Δ as regards focus is given by:

$$\Delta = C\sqrt{\left(\frac{\Delta V}{V}\right)^2 + \left(2\frac{\Delta I}{I}\right)^2 + \left(\frac{\Delta E}{V}\right)^2}$$

Therein, C is an instrumental constant, i.e. the chromatic aberration coefficient, which is determined by the design of the objective lens, ΔV is the spread in the acceleration potential V, ΔI is the spread in the lens current I, and ΔE is the thermal energy spread of the electrons.

Fluctuations of the acceleration potential V can be limited through an optimum design of the high-voltage generator 5. The instability ΔI of the lens current I can be highly reduced by utilizing, for example magnetically saturated lenses or superconducting lenses. Paying attention to the reduction of ΔE makes sense only in an electron microscope whose acceleration potential and lens currents have been optimally stabilized. In that case the thermal energy spread of the electrons is the decisive factor as regards instability. ΔE can be reduced by selecting, for example a field emission source or a pn emitter as the electron source. Electron sources of this kind are capable of generating stable electron beams of comparatively high intensity.

For the chromatic aberration ultimately remaining correction is made by the amplitude part of the weighting factor.

Finally, all Fourier transformed images multiplied by a weighting factor are summed so as to form a linear combination. This linear combination contains the wave function φ of the object 17 in the reference image plane 23. The general wave function ψ in said plane 23 can be written in simplified form as:

$$\psi = C + \phi,$$

in which the constant term C is assumed to be equal to 1 hereinafter for the sake of simplicity. However, experimentally measured is the intensity of an image which can be expressed as $$|\Psi|^2 = |1+\phi|^2 = 1 + \phi + \phi^* + |\phi|^2$$

The image thus obtained contains a zero-order component, a linear part $\phi + \phi^*$ and a non-linear part $|\phi|^2$.

The linear part $\phi + \phi^*$ is a superposition of the linear parts of each image and is in principle identical for each image, backpropagated to the reference image plane 23. In the Fourier space this linear image information is concentrated on two spheres. In the approximation of this method, however, the two spheres are represented by two paraboloids, one for φ and one for φ*. The non-linear part $|\phi|^2$, however, differs for each image and is uniformly distributed across in the Fourier space. This means that the linear part is intensified with respect to the non-linear part by summing the images and also that the signal-to-noise ratio is enhanced. The separation between the linear and the non-linear part of the image information is realised by selecting only the information on one of the paraboloids, resulting in the wave function φ of the object 17. The linear part thus produces the wave function φ of the object 17. Because the method utilizes a recursive algorithm, the linear/non-linear ratio can be maximized by iterative repetition. Such iterative repetition includes that the non-linear contribution on the paraboloid from the last cycle is substracted in the next cycle of the iteration, without making use of any supplementary recorded images. Each time correction takes place for remaining non-linear information on the paraboloid which is calculated on the basis of the linear information obtained during the preceding iteration step.

The wave function φ thus obtained can subsequently be backpropagated from the image plane 23 to the exit plane 25 of the object 17. During this known step of the method, the wave function φ is multiplied by the inverse transfer function of the microscope, after which inverse two-dimensional Fourier transformation takes place. The inverse transfer function implies elimination of the phase shift caused by spherical aberration and defocus, astigmatism and beam tilt. The projected atomic structure of the object 17 can be derived from the wave function thus obtained in the object plane 27. For a thin object this projected structure is represented by the phase of the wave function at the exit plane 25 of the object 17. For a thicker crystalline object, irradiated along a zone axis use is made of an algorithm based on channelling theory. According to channelling theory, when an electron beam is incident on a crystal parallel to columns of atoms channelling takes place in the individual columns. The electrons are captured in said columns so that an unambiguous relationship exists between the type of column and the wave function at the exit plane 25 of the crystal at the area of said column. The relationship is then independent of the composition of neighbouring columns. Knowledge of the wave function thus leads to projected atomic structure information. An additional advantage of the method in accordance with the invention consists in the resolution enhancement of the information obtained. Contemporary high-resolution electron microscopes have a point resolution or structural resolution amounting to approximately 2 Å. This is the maximum resolution with which details in the image can be directly visually interpreted. The resolution of the information present in the wave function of the exit plane 25 of the object 17, however, amounts to approximately 1 Å when use is made of a field emission source. Because the described method for determining the object structure utilizes all information present in the images for restoring the wave function at the exit plane 25 of the object 17, the resolution limit can be improved to approximately 1 Å.

Because of the desirable high-resolution, it is very important that all parameters remain stable during the measurements. The method allows for the tracing of residual beam tilting. Because the number of images per measurement is comparatively large (in the order of 50 images), focus drift and object drift could occur during the exposures. Object drift causes image shift, but image shift can appear also as a consequence of misalignment. All these disturbances can be determined by means of the method. Further, image rotation can occur due to current variations in the objective lens. This effect can be compensated for, for example, electron-optically.

In order to determine the extent of focus drift, the total focus interval is passed through in both directions. By preferably comparing the first and the last image, the total focus drift can be determined. Assuming that the focus drift rate is constant, correction can be made by linear interpolation. The object drift occurring during the recording of the images with can be determined by establishing a cross correlation between images at neighboring focus so that the mutual lateral shift can be very accurately determined. This accuracy can be further improved by successively passing through the focus interval in both directions and by determining the lateral shift between two images, assuming that the object drift rate is constant.

Tilting of the incident electron beam with respect to the optical axis of the electron microscope causes a shift of the said paraboloid in the direction of beam tilting and over a distance which is linearly proportional to the tilt angle. The tilt angle can be very accurately determined by measuring the shift of the paraboloid. Contrary to focus drift and object drift which occur during the recording of the images, beam tilting depends exclusively on the alignment of the microscope prior to the start of recording. Therefore, the high-resolution electron microscope preferably comprises an automatic alignment system.

After determination of the magnitude of the described image-disturbing phenomena, the relevant compensation can be made in the transfer function during restoration of the wave function at the exit plane 25 of the object 17. Furthermore, the microscope should comprise a detection system whose detection medium has the same sensitivity and the same resolution as a photographic plate; moreover, it should be readable on line. The computer memory whereto the recorded information is applied should have a high storage capacity. Because of the large number of images to be recorded within a very short period of time because of practical problems such as focus and object drift, for example mechanical transport of photographic plates is too time consuming. A further advantage then consists in that information stored in the image processing system is immediately available for further image processing.

The described method enables the projected structure of a crystalline object of up to approximately 100 Å, being a realistic thickness in high-resolution electron microscopy, to be determined on the basis of 50 images, recorded in image planes spaced approximately 3 nm apart, with an ultimate resolution of approximately 1 Å.

I claim:

1. A method for directly deriving amplitude and phase information of an object as an electron wave function formed by means of a number of object images recorded with a high-resolution electron microscope, said images being recorded in image planes with slightly different defocus values, characterized in that the spacing of the image planes is chosen to be so small that, through a substantially continuous series of images as a function of the defocus value, a substantially three-dimensional image area is recorded, on which a quasi-three-dimensional Fourier transformation is performed so as to separate linear and non-linear image information in order to restore the electron wave function.

2. A method as claimed in claim 1, characterized in that a quasi-three-dimensional Fourier transformation is achieved by two dimensional Fourier transformation of the recorded images, followed by multiplication by a complex weighting factor describing back-propagation of an image to a selected reference image plane and compensating for chromatic aberration.

3. A method as claimed in claim 1, characterized in that the linear image information is concentrated on spheres in a Fourier space, the non-linear image information being uniformly distributed across the Fourier space.

4. A method as claimed in claim 2, characterized in that the chromatic aberration of the high-resolution electron microscope is corrected by dividing, in each point of the spheres, the value in that point by an attenuation factor for chromatic aberration in the relevant point.

5. A method as claimed in claim 1, characterized in that the method utilizes iterative repetition to intensify the linear part with respect to the non-linear part.

6. A method as claimed in claim 1; characterized in that the electron wave function at the exit plane of the object is calculated from the electron wave function in the reference image plane by multiplying the two-dimensional Fourier transformation of the electron wave function at the reference image plane by a phase factor for correction of spherical aberration and defocus, astigmatism and beam-tilt and by subsequently performing an inverse two-dimensional Fourier transformation.

7. A method as claimed in claim 6, characterized in that after back-propagation of the electron wave function from the image plane to the exit plane of the object, a channelling operation is performed to determine a projected atomic structure of the object.

8. A method as claimed in claim 1, characterized in that the method is used for resolution enhancement of images recorded in a high-resolution electron microscope.

9. A method as claimed in claim 1, characterized in that for the determination of focus drift, occurring during recording of a series of images, a number of images having different defocus values are recorded in an opposite direction, the focus drift being determined by comparison of two extreme images.

10. A method as claimed in claim 1, characterized in that for the determination of object drift occurring during the recording of a series of images, a cross correlation of images with neighbouring defocus values is made, the drift of the object being determined from a mutual lateral shift.

11. A method as claimed in claim 1, characterized in that a measure of beam tilting is derived from a shift of a sphere, representing linear image information, in a Fourier space.

12. A high-resolution electron microscope suitable for performing a method as claimed in claim 1.

13. A high-resolution electron microscope as claimed in claim 12, characterized in that it comprises a detection system, an image processing system and an effective electron source which ensures a comparatively small thermal energy spread of electrons to be emitted.

14. A high-resolution electron microscope as claimed in claim 12, characterized in that the detection system comprises a detection medium which can be read on-line and which has sensitivity and resolution comparable to the sensitivity and resolution of, for example a photographic plate.

* * * * *